(12) United States Patent
Pril

(10) Patent No.: US 7,251,042 B2
(45) Date of Patent: Jul. 31, 2007

(54) LITHOGRAPHIC APPARATUS, INTERFEROMETER AND DEVICE MANUFACTURING METHOD

(75) Inventor: Wouter Onno Pril, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 286 days.

(21) Appl. No.: 10/976,346

(22) Filed: Oct. 29, 2004

(65) Prior Publication Data

US 2005/0179879 A1   Aug. 18, 2005

(30) Foreign Application Priority Data

Oct. 30, 2003   (EP)   ................... 03078419

(51) Int. Cl.
*G01B 11/02* (2006.01)

(52) U.S. Cl. ...................... 356/500; 356/511
(58) Field of Classification Search ................ 356/500, 356/511, 486, 487, 520
See application file for complete search history.

(56) References Cited

U.S. PATENT DOCUMENTS

| 5,790,253 A * | 8/1998 | Kamiya ..................... 356/500 |
| 6,271,923 B1 * | 8/2001 | Hill ............................ 356/487 |
| 6,842,248 B1 * | 1/2005 | Binnard et al. ............. 356/401 |
| 7,019,840 B2 * | 3/2006 | Wang et al. ................. 356/495 |
| 2003/0223079 A1 * | 12/2003 | Hill ............................ 356/500 |

\* cited by examiner

*Primary Examiner*—Layla G. Lauchman
*Assistant Examiner*—Jonathon Cook
(74) *Attorney, Agent, or Firm*—Pillsbury Winthrop Shaw Pittman, LLP

(57) ABSTRACT

A lithographic apparatus includes an interferometer configured to measure a position of a mirror of the lithographic apparatus. For measuring unflatness of the mirror the interferometer includes a modulator configured to modulate a position of an input beam of the interferometer, a synchronous detector configured to synchronously detect an interfered, modulated beam, and a calculator configured to calculate an unflatness of an area of the mirror from an effect of the modulation of the position of the input beam on an output signal of the synchronous detector. The modulator can include a rotatable, tilted, plan plate.

29 Claims, 3 Drawing Sheets

LITHOGRAPHIC APPARATUS, INTERFEROMETER AND DEVICE MANUFACTURING METHOD

PRIORITY INFORMATION

This application claims priority from European Patent Application No. 03078419.3, filed Oct. 30, 2003, the content of which is herein incorporated by reference in its entirety.

BACKGROUND

1. Background of the Invention

The present invention relates to a lithographic apparatus, an interferometer and a device manufacturing method.

2. Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Conventional lithographic apparatus include so-called steppers, in which each target portion is irradiated by exposing an entire pattern onto the target portion at once, and so-called scanners, in which each target portion is irradiated by scanning the pattern through the beam of radiation in a given direction (the "scanning"-direction) while synchronously scanning the substrate parallel or anti-parallel to this direction.

In such a lithographic apparatus, an interferometer might be used for measuring displacements with a high accuracy. U.S. Pat. No. 4,784,490 discloses a typical high stability plane mirror interferometer.

Although such an interferometer provides a highly accurate measurement, measurement errors may occur due to unflatness of the measurement mirror. When the measurement mirror is displaced, e.g., in a direction perpendicular to the measurement beam touching the measurement mirror, the measurement beam may touch the mirror at a different area on the mirror. Unflatness of the mirror may thus result in an error in the distance measurement by the interferometer.

SUMMARY

Embodiments of the present invention include an interferometer configured to improve accuracy of an interferometric measurement.

According to an embodiment of the invention, there is provided a lithographic apparatus including an illumination system configured to condition a beam of radiation; a support structure configured to support a patterning device, the patterning device serving to impart the beam of radiation with a pattern in its cross-section; a substrate table configured to hold a substrate; a projection system configured to project the patterned beam onto a target portion of the substrate, and an interferometer configured to measure a position of a mirror of the lithographic apparatus, wherein the interferometer includes a modulator configured to modulate a position of an input beam of the interferometer; a synchronous detector configured to synchronously detect a position modulated interfered beam of the interferometer; and a calculator configured to calculate an unflatness of an area of the mirror from an effect of a modulation of the position of the input beam on an output signal of the synchronous detector.

With the modulator, a position of the input beam of the interferometer may be modulated, which leads to a modulation of a position of the measurement beam on the measurement mirror. Likewise, a position of the reference beam on the reference mirror is also position modulated. A resulting interfered beam resulting from the measurement beam and the reference beam may, as a consequence, also be position modulated. This interfered modulated beam may be detected (via a phase detector) by a synchronous detector and from the output signal of the synchronous detector an unflatness of an area of the mirror, i.e. the measurement mirror is calculated. By continuously or stepwise translating the measurement mirror in a direction perpendicular to the measurement beam when touching the measurement mirror, multiple measurements of an unflatness can be performed from which a flatness map of all measured areas of the mirror can be derived. Strictly speaking, the interferometer is configured to measure a relative position of the measurement mirror. A position can be determined from the relative position in combination with a reference position. When in this document is referred to the position of the mirror, this is to be understood as comprising a relative as well as an absolute position.

In an embodiment of the invention, the modulator includes a rotatable, tilted, plan plate which is advantageously driveable by a motor. As the input beam of the interferometer passes through the plate, its position is modulated due to the rotation of the plate, and thus due to the change in orientation of the plan plate at the position where the input beam travels through the mirror. A benefit of using a plan plate is that the pointing direction of the beam is not influenced by the plan plate as long as the faces of both sides are parallel to each other.

In an embodiment of the invention, the modulator advantageously includes an angle sensor configured to measure a position of the rotatable plate, for generating a modulation frequency reference signal to be used for the synchronous detection. In an embodiment of the invention, the angle sensor includes a cam disc and two slotted opto switches separated at about 90 degrees from each other, for detecting a position of the cam disk, the angle sensor for generating a modulation frequency reference signal. In this manner, a simple yet highly accurate modulation frequency reference signal can be generated, the reference signal having a square wave form. Alternatively, the angle sensor can be adapted to generate a sinusoidal signal.

Highly accurate results will be achieved in an advantageous embodiment wherein the interferometer includes a corner cube for the measurement beam to touch the mirror at two distinct areas. As will be known to a person skilled in the art, an interferometer including a corner cube provides a set up which is less sensitive to a geometrical deviations. In combination with the modulation according to an embodiment of the invention, the measurement beam which touches the mirror twice will also be modulated at these two positions. Thus, with each measurement of unflatness, a sum of a measurement for the two respective positions where the measurement beam touches the mirror, is achieved. Also, the fact that the mirror is touched twice enables an easy determination of an angular displacement of the measurement mirror, as will be described in more detail below. The expression position measurement or displacement measurement in this document thus not only refer to linear position or displacement measurement but also to angular measurments.

In an embodiment of the invention, a synchroneous detector includes a multiplier configured to multiply an output signal of a phase detector with the modulation frequency reference signal to obtain a multiplied signal; and a low pass filter configured to low pass filter the multiplied signal to obtain a low pass filtered signal, the low pass filtered signal providing a measure of the slope of a surface of the mirror in at least a part of the areas of modulation on the mirror. Thus, only a component of the output signal which is due to the position modulation may be filtered out. As the modulated beam touches the mirror in an area which is determined by the position modulation, a signal now results which provides a measure for the slope of the surface of the mirror in at least a part of the area touched by the modulated measurement beam. In the case described above where the mirror is touched twice, the signal provides information on the combined slopes at the two areas of the measurement mirror touched by the beam.

In an embodiment of the invention, the calculator includes an integrator configured to integrate the low pass filtered signal along a line over the mirror to obtain an integrated signal along the line; an optional reference value input configured to provide a flatness at a starting point on the line; a repetitive difference determiner configured to repetitively determine a flatness at a following point on the line located a distance equal to a distance between the two distinct points on the mirror, from a point of which the flatness has been determined, by summing a value of the integrated signal to the flatness at the point of which the flattness has been determined. To obtain a mirror map of an area of the mirror (e.g. a line), the output signal of the synchroneous detector is integrated along the line. By optionally providing a reference value for a flatness at an (arbitrary) point on the line, the flatness at other points on the line can be calculated. If no reference value is provided, an arbitrary value, e.g. zero, can be used for the calculation of the (relative) flatness. In case that an interferometer wherein the measurement beam touches the measurement mirror at two distinct positions, is used, the points of which the flatness are determined are separated by a distance equal to a distance between the two distinct points, as each measurement effectively provided a sum (linear combination) of flatness information with regard to the two points on which the mirror is touched by the measurement beam.

In an embodiment of the invention, a frequency of modulation of the modulator is above a bandwidth of a position control system of the mirror or an element of the lithographic system connected thereto. Alternatively or in addition thereto, it is possible that the position control system includes a notch filter configured to suppress the frequency of modulation from an input signal of the position control system. In this manner, it is prevented that the position control system reacts on the modulation, and thus is prevented that an unwanted movement of the mirror, whether or not in synchronism with a frequency of modulation, occurs.

Similar benefits can be achieved with the interferometer and the device manufacturing method according to an embodiment of the invention.

The modulator according to an embodiment of the invention for modulating a position of an input beam of the interferometer includes a synchroneous detector configured to synchroneously detect a position modulated interfered beam of the interferometer; and a calculator configured to calculate an unflatness of an area of the mirror from an effect of the modulating of the position of the input beam on an output signal of the synchroneous detector.

The method according to an embodiment of the invention includes providing a substrate; providing a beam of radiation using an illumination system; using a patterning device to impart the beam of radiation with a pattern in its cross-section; projecting the patterned beam of radiation onto a target portion of the substrate, and measuring a position of a mirror of the lithographic apparatus with an interferometer, the measuring including modulating a position of an input beam of the interferometer; synchroneously detecting a position modulated interfered beam of the interferometer; and calculating an unflatness of an area of the mirror from an effect of the modulating of the position of the input beam on an output signal of the synchroneous detector.

The method includes multiplying an output signal of the synchroneous detector with a modulation frequency reference signal to obtain a multiplied signal; and low pass filtering the multiplied signal to obtain a low pass filtered signal.

Further, the method includes integrating the low pass filtered signal along a line over the mirror to obtain an integrated signal along the line; determining a flatness at a starting point on the line; and repetitively determining a flatness at a following point on the line located a distance equal to a distance between the two distinct points on the mirror, from a point of which the flatness has been determined, by summing a value of the integrated signal to the flatness at the point of which the flatness has been determined.

A method of measuring a position of a mirror of a lithographic apparatus with an interferometer, in accordance with an embodiment of the invention, includes: modulating a position of an input beam of the interferometer; synchronously detecting a position modulated interfered beam of the interferometer; and calculating an unflatness of an area of the mirror from an effect of the modulating of the position of the input beam on an output signal of a synchronous detector.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a beam of radiation with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning devices, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
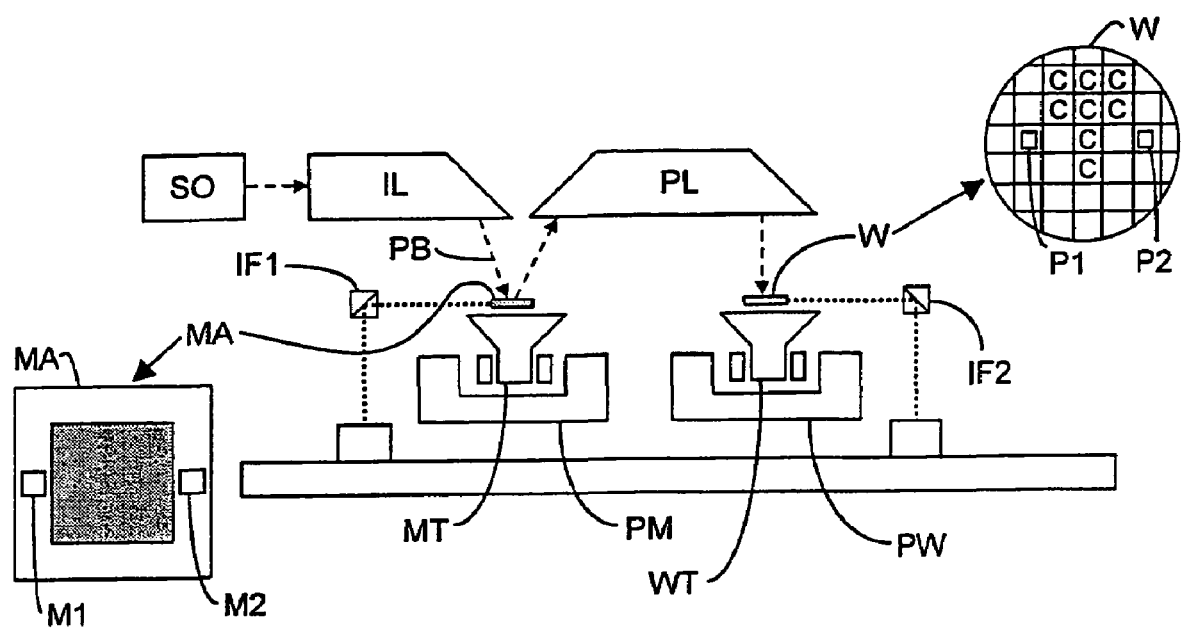
FIG. 1 depicts a lithographic apparatus in accordance with an embodiment of the invention.

FIG. 1 schematically depicts a lithographic apparatus according to an embodiment of the invention. The apparatus includes an illumination system (illuminator) IL configured to condition a beam PB of radiation (e.g. UV or EUV radiation) and a first support structure (e.g. a mask table) MT configured to support a patterning device (e.g. a mask) MA and connected to a first positioning device PM configured to accurately position the patterning device with respect to the projection system, ("lens"), item PL. The apparatus also includes a substrate table (e.g. a wafer table) WT configured to hold a substrate (e.g. a resist-coated wafer) W and connected to a second positioning device PW configured to accurately position the substrate with respect to the projection system ("lens"), item PL; the projection system (e.g. a reflective projection lens) PL being configured to image a pattern imparted to the beam of radiation PB by patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector including for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may includes an adjusting device configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the beam of radiation PB, having a desired uniformity and intensity distribution in its cross-section.

The beam of radiation PB is incident on the mask MA, which is held on the mask table MT. Being reflected by the mask MA, the beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus may be used in the following example modes:

Step mode: the mask table MT and the substrate table WT are kept essentially stationary, while an entire pattern imparted to the beam of radiation is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the beam of radiation is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the beam of radiation is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
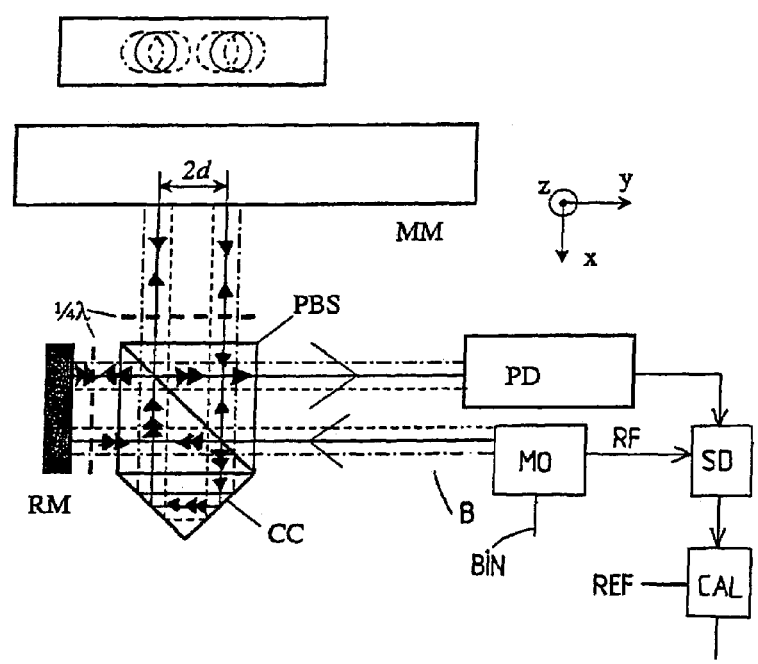
FIG. 2 depicts an interferometer according to an embodiment of the invention.

FIG. 2 shows an interferometer configured to measure a position of a measurement mirror MM. The measurement mirror MM can be arranged, for example, on the support structure MT that is configured to support the patterning device or on the substrate table WT that is configured to hold the substrate. The interferometer is supplied with an incoming beam B, which passes through a polarizing beam splitter PBS. A part of the incoming beam B passes the polarizing beam splitter PBS and touches a reference mirror RM while another part of the beam B is directed by the polarizing beam splitter PBS to the measurement mirror MM. Both the beams for the reference mirror RM and the measurement mirror MM are reflected and due to the corner cube CC attached to the polarizing beam splitter PBS, the measurement beam touches the measurement mirror MM at a second position on the measurement mirror MM while the reference beam touches the reference mirror RM at a second position on the reference mirror RM. Both beams reach the phase detector PD which measures an interference of the beams. A displacement of the measurement mirror MM will result in a change of a length of the optical path of the measurement beam and thus resulting in a phase change in the measurement beam when reaching the phase detector, which leads to a change of the resulting, interfered beam detected by the phase detector. In FIG. 2, the plane of the drawing represents an x, y dimension, while a third, z dimension extends perpendicular to the plane of drawing. As will be described in more detail with reference to FIGS. 3a, 3b and 3c below, the incoming beam B is position modulated as schematically represented by the dotted lines on both sides of the line representing the incoming beam B which each represent an ultimate position of the position modulated beam. To achieve the position modulation of the beam, the interferometer includes a modulator MO which is supplied with the (yet unmodulated) beam Bin.

The modulator MO in this embodiment of the invention further provides a reference frequency signal RF to be used by the synchronous detector SD as will be explained below.

Due to the position modulation of the incoming beam B, the measurement beam may be position modulated on the measurement mirror MM and the reference beam may likewise be position modulated on the reference mirror RM. Also, the beam reaching the phase detector PD may be position modulated. As a result of the position modulation, the measurement mirror is touched by the measurement beam over respective areas around a stationary, i.e. unmodulated, position of the measurement beam. As a consequence, the signal detected by the phase detector includes information about the length of the optical path of the measurement beam over the area of the mirror touched due to the modulation of the beam. This information is derived from the output signal of the phase detector PD by the synchronous detector SD. The synchronous detector SD multiplies the output signal of the phase detector PD with the reference frequency (reference signal) RF and provides for a low pass filtering of an output signal of the multiplication. The resulting signal is supplied from the synchronous detector to the calculator CAL. The signal provided by the synchronous detector SD provides a measure for a linear combination of the slope (i.e. the unflatness) of the mirror in the respective areas of the measurement mirror MM touched by the modulated measurement beam. The calculator calculates an unflatness of an area of the mirror from the output signal of the synchronous detector. First, the calculator integrates the signal supplied to it by the synchronous detector. Further, the calculator is provided in this embodiment with a reference value input REF to which a flatness of the mirror at a starting point on a line is provided. The mirror is (horizontally) moved in a direction along the y-axis, and repetitively the beam is measured by the phase detector and synchronously detected by the synchronous detector SD. The signal supplied to the calculator is then integrated along the y-axis and starting with the reference value providing the flatness at a starting point on the line, repetitively a flatness at a following point on the line located a distance 2d from the previous point, is determined by summing the value of the integrated position at a distance equal to the averaged distance of the following point and the previous point (where flatness has just been determined). Thus, starting with the reference value, a flatness at point at a distance 2d from the starting point is calculated (using the integrated signal at a distance d), and from thereon a flatness at a point 4d from the starting point is calculated (using the integrated signal at a distance 3d), following by calculation at the point 6d, etc. The flatness of the mirror is to be understood as a flatness function, i.e. a flatness having a constant value implies that the mirror does not show any irregularities, thus representing a theoretical totally flat mirror.

Summarizing, the interferometer in FIG. 2 provides at the output of its synchronous detector a signal providing information on a (linear) combination of a slope of the mirror in the two areas touched by the measurement beam which are separated a distance $2d$ from each other, and by displacing the mirror in e.g. a y-direction, multiple measurements on a surface of the mirror are performed. Each measurement provides an indication of the slope of the mirror. By determining a reference value at one point of the mirror, the flatness of the mirror at the other measured points can be calculated from the reference value. For a simple calculation, the measurement mirror is moved repetitively over a distance $2d$ in the y-direction, enabling a simple calculation of the flatness of the mirror at the points 0, 2d, 4d, 6d, etc.

Figure 3A:
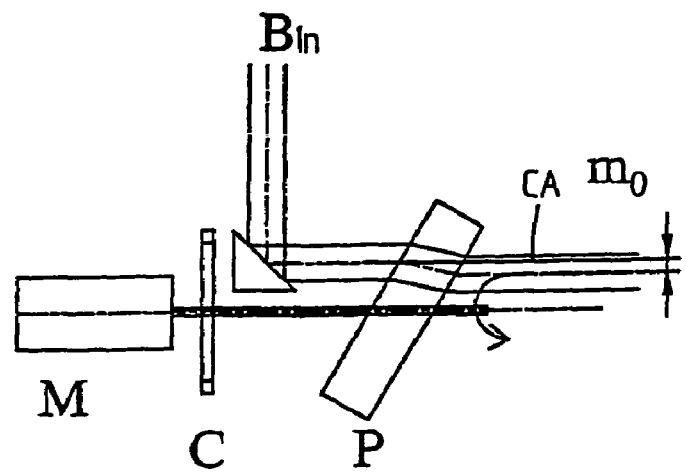
FIGS. 3a, 3b and 3c depict a beam modulator for the interferometer according to FIG. 2, and a detailed view of an angle sensor of the beam modulator.
Figure 3B:
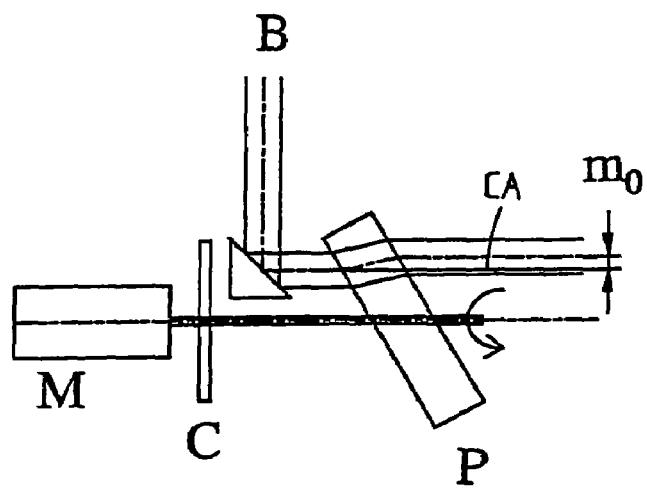
Figure 3C:
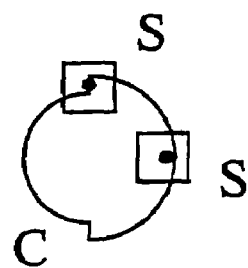

The modulator is now described with reference to FIG. 3a. The modulator includes a tilted, plan plate P which is rotated around an axis by a motor M. An incoming beam Bin is passed through tilted plan plate P. FIG. 3a depicts a position of the plan plate P when tilted to the right, while FIG. 3b depicts a position of the plan plate P when tilted to the left, i.e. rotated 180° with respect to the position depicted in FIG. 3a. Due to reflection in the plate P, the incoming beam Bin is translated. As the motor M rotates the tilted plan plate P, the beam is modulated with respect to a center axis CA by an amplitude $m_0$. The modulator as depicted in FIGS. 3a and 3b further includes a cam disc C, which is connected to the axis of rotation of the motor M and which is shown in FIGS. 3a and 3b in a side view. FIG. 3c depicts an embodiment of the cam disc in front view. Further, FIG. 3c depicts two sensors S, e.g. optical sensors, such as light slots, however alternative sensors, such as magnetic, proximity, etc. can be used. When the cam disc C rotates, the sensors S are periodically covered or not covered by the cam disc due to the two parts of the disc C having a different diameter. As will be appreciated by a person skilled in the art, a reference frequency signal can be derived from the respective output of the sensors S, and thus providing for a modulation reference frequency signal in a simple yet highly accurate manner. The sensor as systematically depicted in FIG. 3 provides for a square wave signal. However, it will be appreciated that other configurations, e.g. providing a sine or cosine signal making use of a different cam, or any other suitable angle sensor which might be known per se, could be used. To avoid an interfering of the modulation with any measurements of the position of the mirror in an operative condition of the interferometer, a notch filter can be provided for suppressing the frequency of modulation in a signal which is provided by the interferometer to a position control system controlling a position of the mirror or an element connected thereto. Alternatively or in addition thereto, the frequency of modulation of the modulator can be chosen such that it is above a bandwidth of such a position control system.

In lithographic apparatus, both linear and rotational displacements can generally be measured by interferometers. This can be done by separate interferometers at a certain distance from each other, or alternatively angle interferometers can be used. Calculation of the correction can be done by first calculating the mirror unflatness and then calculating the effect on the angle measurement. It can also be done more directly. Since an interferometer angle measurement always exist of a subtraction (either optical or numerical) of a displacement at two distinct points, the angle correction can be directly calculated from the integrated signal as described above, which is on itself also a difference of unflatness at two distinct points or areas on the measurement mirror if touched twice by the measurement beam. Mathematically there is no substantial difference between the two methods.

The beam modulator of FIG. 3 moves the input beam in a circular way around the nominal beam. It will be appreciated that the horizontal part of the modulation as schematically drawn in FIG. 3 and that the vertical modulation (thus a modulation of a position of the beam touching the mirror in a direction perpendicular to the y direction in FIG. 1) provides relevant mirror unflatness information. It can be used to determine a vertical slope of the mirror as function of the horizontal position. Typically stages used in lithography have a large horizontal range at least in one direction and a small vertical range. It might be advantageous to correct the measurement for unflatness in the vertical direction. It also can enable relaxation of the mirror unflatness specification which may lower a manufacturing cost of the mirror.

While specific embodiments of the invention have been described above, it will be appreciated that the invention may be practiced otherwise than as described. The description is not intended to limit the invention.

What is claimed is:

1. A lithographic apparatus comprising:
    (a) an illumination system configured to condition a beam of radiation;
    (b) a support structure configured to support a patterning device, the patterning device serving to impart the beam of radiation with a pattern in its cross-section;
    (c) a substrate table configured to hold a substrate;
    (d) a projection system configured to project the patterned beam onto a target portion of the substrate, and
    (e) an interferometer configured to measure a position of a mirror of the lithographic apparatus, the interferometer comprising
        (i) a modulator configured to modulate a position of an input beam of the interferometer;
        (ii) a synchronous detector configured to synchronously detect a position modulated interfered beam of the interferometer using a modulation frequency reference signal; and
        (iii) a calculator configured to calculate an unflatness of an area of the mirror from an effect of a modulation of the position of the input beam on an output signal of the synchronous detector.

2. The lithographic apparatus of claim 1, wherein the modulator comprises a rotatable, tilted, plan plate.

3. The lithographic apparatus of claim 2, wherein the rotatable, tilted, plan plate is drivable by a motor.

4. The lithographic apparatus of claim 3, wherein the modulator comprises an angle sensor configured to measure a position of the rotatable plate.

5. The lithographic apparatus of claim 4, wherein the angle sensor comprises a cam disc and two slotted opto switches separated at about 90 degrees from each other, configured to detect a position of the cam disc, the angle sensor being configured to generate a modulation frequency reference signal.

6. The lithographic apparatus of claim 1, wherein the interferometer comprises a corner cube arranged such that a measurement beam impinges on the mirror at two distinct areas.

7. The lithographic apparatus of claim 1, wherein the synchronous detector comprises a multiplier configured to multiply an output signal of a phase detector with the modulation frequency reference signal to obtain a multiplied signal; and a low pass filter configured to low pass filter the multiplied signal to obtain a low pass filtered signal, the low pass filtered signal providing a measure of the slope of a surface of the mirror in at least a part of the area(s) of modulation on the mirror.

8. The lithographic apparatus of claim 7, wherein the calculator comprises:
an integrator configured to integrate the low pass filtered signal along a line over the mirror to obtain an integrated signal along the line; a reference value input configured to provide a flatness at a starting point on the line; and a repetitive difference determiner configured to repetitively determine a flatness at a following point on the line located at a distance equal to a distance between two distinct points on the mirror, from a point of which the flatness has been determined, by summing a value of the integrated signal to the flatness at the point of which the flatness has been determined.

9. The lithographic apparatus of claim 1, wherein a frequency of modulation of the modulator is above a bandwidth of a position control system of the mirror or an element of the lithographic system connected thereto, and/or wherein the position control system comprises a notch filter configured to suppress the frequency of modulation from an input signal of the position control system.

10. The lithographic apparatus of claim 1, wherein the position modulated interfered beam is created by interference between a reference beam and a measurement beam which has its position modulated on the mirror.

11. The lithographic apparatus of claim 1, wherein the mirror is arranged on the substrate table.

12. The lithographic apparatus of claim 1, wherein the mirror is arranged on the support structure.

13. The lithographic apparatus of claim 1, wherein the modulator is configured to modulate the position of the input beam of the interferometer to create a modulated input beam, and wherein the modulated input beam is split into a modulated measurement beam to impinge on the mirror and a modulated reference beam to impinge on a reference surface.

14. The lithographic apparatus of claim 13, wherein the position modulated interfered beam results from interference between the modulated measurement beam and the modulated reference beam.

15. An interferometer for measuring a position of a mirror, the interferometer comprising:
a modulator configured to modulate a position of an input beam of the interferometer;
a synchronous detector configured to synchronously detect a position modulated interfered beam of the interferometer using a modulation frequency reference signal; and
a calculator configured to calculate an unflatness of an area of the mirror from an effect of the modulating of the position of the input beam on an output signal of the synchronous detector.

16. The interferometer of claim 15, wherein the position modulated interfered beam is created by interference between a reference beam and a measurement beam which has its position modulated on the mirror.

17. The interferometer of claim 15, wherein the mirror is arranged on a substrate table of a lithographic apparatus.

18. The interferometer of claim 15, wherein the mirror is arranged on a support structure of a lithographic apparatus, said support structure being configured to support a patterning device.

19. A device manufacturing method comprising:
(a) projecting a patterned beam of radiation onto a target portion of the substrate, and (b) measuring a position of a mirror of a lithographic apparatus with an interferometer, the measuring including
(i) modulating a position of an input beam of the interferometer;
(ii) synchronously detecting a position modulated interfered beam of the interferometer using a modulation frequency reference signal; and
(iii) calculating an unflatness of an area of the mirror from an effect of the modulating of the position of the input beam on an output signal of a synchronous detector;
(c) generating an output signal based on the measured unflatness area of the mirror.

20. The method of claim 19, wherein the synchronously detecting comprises:
multiplying an output signal of the synchronous detector with the modulation frequency reference signal to obtain a multiplied signal; and
low pass filtering the multiplied signal to obtain a low pass filtered signal.

21. The method according to claim 20, wherein the calculating comprises:
integrating the low pass filtered signal along a line over the mirror to obtain an integrated signal along the line;
determining a flatness at a starting point on the line; and
repetitively determining a flatness at a following point on the line located at a distance equal to a distance between two distinct points on the mirror, from a point of which the flatness has been determined, by summing a value of the integrated signal to the flatness at the point of which the flatness has been determined.

22. The method of claim 19, further comprising modulating a position of a measurement beam on the mirror and creating interferences between the measurement beam and a reference beam.

23. The method of claim 19, wherein the mirror is arranged on a substrate table configured to hold the substrate.

24. The method of claim 19, wherein the mirror is arranged on a support structure configured to support a patterning device.

25. A method of measuring a position of a mirror of a lithographic apparatus with an interferometer, the method comprising:
(i) modulating a position of an input beam of the interferometer;
(ii) synchronously detecting a position modulated interfered beam of the interferometer using a modulation frequency reference signal; and
(iii) calculating an unflatness of an area of the mirror from an effect of the modulating of the position of the input beam on an output signal of a synchronous detector;
(iv) generating an output signal based on the measured unflatness area of the mirror.

26. The method of claim 25, wherein the mirror is arranged on a substrate table configured to hold the substrate.

27. The method of claim 25, wherein the mirror is arranged on a support structure configured to support a patterning device.

28. A lithographic apparatus comprising:
(a) an illumination system configured to condition a beam of radiation;
(b) a support structure configured to support a patterning device, the patterning device serving to impart the beam of radiation with a pattern in its cross-section;

(c) a substrate table configured to hold a substrate;
(d) a projection system configured to project the patterned beam onto a target portion of the substrate, and
(e) an interferometer configured to measure a position of a mirror of the lithographic apparatus, the interferometer comprising
  (i) a modulator configured to modulate a position of a measurement beam of the interferometer to create a modulated measurement beam, the modulated measurement beam to impinge on the mirror;
  (ii) a synchronous detector configured to synchronously detect a position modulated interfered beam of the interferometer using a modulation frequency reference signal, the position modulated interfered beam resulting from interference between the modulated measurement beam reflected by the mirror and a modulated reference signal; and
  (iii) a calculator configured to calculate an unflatness of an area of the mirror from an effect of a modulation of the position of the measurement beam on an output signal of the synchronous detector.

29. The lithographic apparatus of claim 28, wherein the modulated reference signal is reflected on a reference surface.

* * * * *